United States Patent
Marti

(10) Patent No.: US 10,318,670 B2
(45) Date of Patent: Jun. 11, 2019

(54) VENUE-BASED REAL-TIME CROWD MODELING AND FORECASTING

(71) Applicant: APPLE INC., Cupertino, CA (US)

(72) Inventor: Lukas M. Marti, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 256 days.

(21) Appl. No.: 15/245,017

(22) Filed: Aug. 23, 2016

(65) Prior Publication Data

US 2017/0083647 A1    Mar. 23, 2017

Related U.S. Application Data

(63) Continuation of application No. 13/664,354, filed on Oct. 30, 2012, now Pat. No. 9,449,121.

(51) Int. Cl.
*G06F 17/50* (2006.01)

(52) U.S. Cl.
CPC ............... *G06F 17/5009* (2013.01)

(58) Field of Classification Search
None
See application file for complete search history.

(56) References Cited

U.S. PATENT DOCUMENTS

| | | |
|---|---|---|
| 6,256,577 B1 | 7/2001 | Graunke |
| 9,113,309 B2 | 8/2015 | Uilecan et al. |
| 2007/0087756 A1 | 4/2007 | Hoffberg |
| 2010/0197319 A1 | 8/2010 | Petersen et al. |
| 2011/0140960 A1 | 6/2011 | Wirola et al. |
| 2011/0184945 A1 | 7/2011 | Das et al. |
| 2011/0246148 A1 | 10/2011 | Gupta et al. |
| 2011/0320307 A1 | 12/2011 | Mehta et al. |
| 2012/0047102 A1 | 2/2012 | Petersen et al. |
| 2012/0078667 A1 | 3/2012 | Denker et al. |
| 2012/0214515 A1 | 8/2012 | Davis et al. |
| 2013/0018826 A1 | 1/2013 | Sundararajan et al. |
| 2013/0317944 A1 | 11/2013 | Huang et al. |
| 2014/0018097 A1 | 1/2014 | Goldstein |
| 2014/0040175 A1 | 2/2014 | Sundarajan et al. |

FOREIGN PATENT DOCUMENTS

WO    2010/113028 A2    10/2010

OTHER PUBLICATIONS

U.S. Appl. No. 13/664,354, "Final Office Action", dated Dec. 23, 2014, 29 pages.
U.S. Appl. No. 13/664,354, "Final Office Action", dated Feb. 9, 2016, 36 pages.
(Continued)

*Primary Examiner* — Saif A Alhija
*Assistant Examiner* — Bijan Mapar
(74) *Attorney, Agent, or Firm* — Kilpatrick Townsend & Stockton LLP

(57) ABSTRACT

Crowds of people within an environment can be modeled in real time. A multitude of mobile devices located within an environment can periodically transmit their geographical locations over networks to a remote server. The remote server can use these geographical locations to generate a current real-time model of a crowd of people who possess the mobile devices that transmitted the geographical locations. The remote server can transmit the model over networks back to the mobile devices. The mobile devices can use the received model to present useful information to the users of those mobile devices.

18 Claims, 4 Drawing Sheets

(56) References Cited

OTHER PUBLICATIONS

U.S. Appl. No. 13/664,354, "Non-Final Office Action", dated Jul. 10, 2014, 25 pages.
U.S. Appl. No. 13/664,354, "Non-Final Office Action", dated Jun. 30, 2015, 36 pages.
U.S. Appl. No. 13/664,354, "Notice of Allowance", dated May 18, 2016, 10 pages.
Bullock et al., "Automated Measurement of Wait Times at Airport Security Deployment at Indianapolis International Airport, Indiana", Transportation Research Record: Journal of the Transportation Research, vol. 2177, 2010, pp. 60-68.
Bulut et al., "LineKing: Crowdsourced Line Wait-Time Estimation Using Smartphones", MobiCASE: 4th International Conference on Mobile Computing, Applications, and Services, Seattle, WA, USA, Oct. 11-12, 2012, pp. 205-224.
Ishikawa et al., "Economic and synergistic pedestrian tracking system for indoor environments", Soft Computing and Pattern Recognition, SOCPAR'09, International Conference of. IEEE, Dec. 2009, pp. 522-527.

VENUE-BASED REAL-TIME CROWD MODELING AND FORECASTING

CROSS-REFERENCES TO RELATED APPLICATIONS

This application claims the benefit of U.S. non-provisional application Ser. No. 13/664,354, filed Oct. 30, 2012, entitled "VENUE-BASED REAL-TIME CROWD MODELING AND FORECASTING," the disclosure of which is incorporated by reference herein in its entirety.

BACKGROUND

The present disclosure relates generally to mobile devices, and in particular to techniques for using mobile devices to model crowds of people.

Computers and other electronic devices can communicate with each other over networks such as local area networks, wide area networks, and the Internet. Mobile devices such as cell phones, including so-called smart phones, can communicate with each other wirelessly over a variety of wireless networks including 3G and 4G networks. Such mobile devices also can communicate over the Internet with remote servers using protocols such as Transmission Control Protocol (TCP), Internet Protocol (IP), and Hypertext Transfer Protocol (HTTP).

Users of such mobile devices occasionally find themselves within crowded locales with many other users of such mobile devices. For example, an airport may be populated with a multitude of people moving around from location to location within the airport. Many of these people may be mobile device users. People within crowded locales may often find themselves waiting in lines. Although these people can often use their mobile devices in order to determine where they are currently located, and/or to determine a time at which their flights are scheduled to depart, the dynamic nature of the lines in which these people wait can make it difficult for them to determine how long it will probably take for them to get through those lines.

SUMMARY

Certain embodiments of the present invention can model crowds of people within an environment in real time. For example, a multitude of mobile devices located within an environment can periodically transmit their geographical locations over networks to a remote server. The remote server can use these geographical locations to generate a current real-time model of a crowd of people who possess the mobile devices that transmitted the geographical locations. The remote server can transmit the model over networks back to the mobile devices. The mobile devices can use the received model to present useful information to the users of those mobile devices.

The following detailed description together with the accompanying drawings will provide a better understanding of the nature and advantages of the present invention.

BRIEF DESCRIPTION

DETAILED DESCRIPTION

Figure 1:
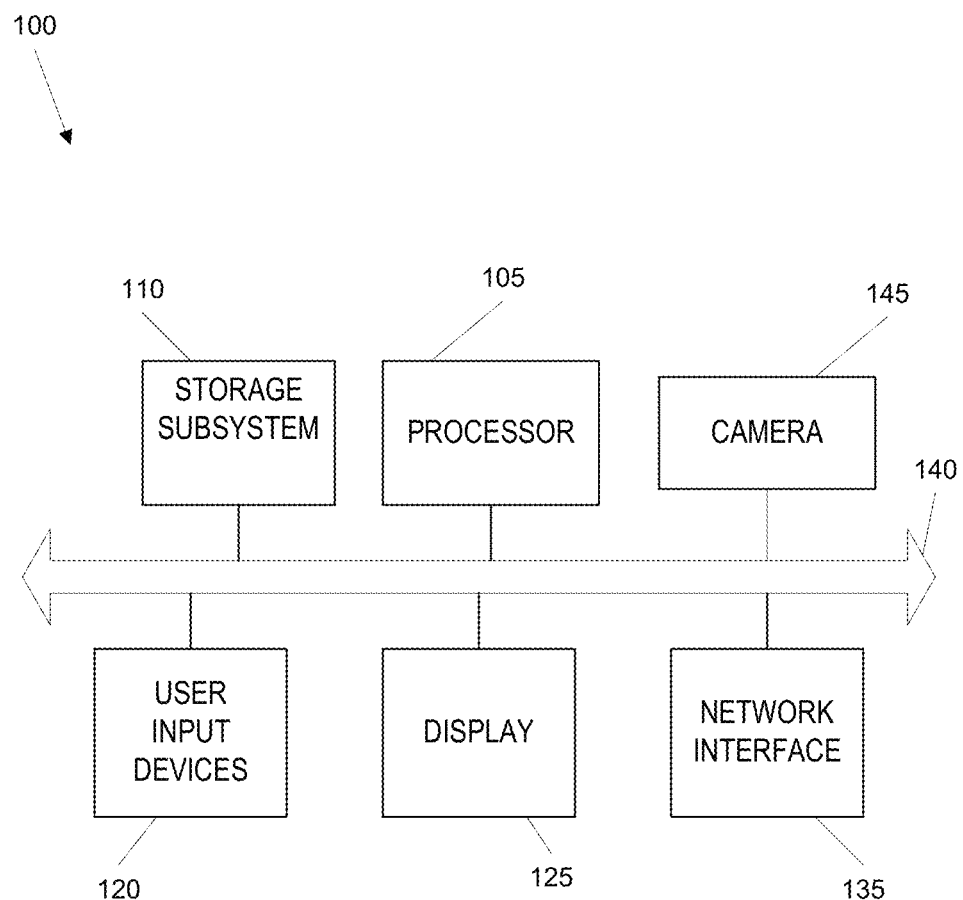
FIG. 1 is a block diagram of a computer system according to an embodiment of the present invention.

FIG. 1 illustrates a computing system 100 according to an embodiment of the present invention. Computing system 100 can be implemented as any of various computing devices, including, e.g., a desktop or, laptop computer, tablet computer, smart phone, personal data assistant (PDA), or any other type of computing device, not limited to any particular form factor. Computing system 100 can include processing unit(s) 105, storage subsystem 110, input devices 120, display 125, network interface 135, and bus 140. Computing system 100 can be an iPhone or an iPad.

Processing unit(s) 105 can include a single processor, which can have one or more cores, or multiple processors. In some embodiments, processing unit(s) 105 can include a general-purpose primary processor as well as one or more special-purpose co-processors such as graphics processors, digital signal processors, or the like. In some embodiments, some or all processing units 105 can be implemented using customized circuits, such as application specific integrated circuits (ASICs) or field programmable gate arrays (FPGAs). In some embodiments, such integrated circuits execute instructions that are stored on the circuit itself. In other embodiments, processing unit(s) 105 can execute instructions stored in storage subsystem 110.

Storage subsystem 110 can include various memory units such as a system memory, a read-only memory (ROM), and a permanent storage device. The ROM can store static data and instructions that are needed by processing unit(s) 105 and other modules of computing system 100. The permanent storage device can be a read-and-write memory device. This permanent storage device can be a non-volatile memory unit that stores instructions and data even when computing system 100 is powered down. Some embodiments of the invention can use a mass-storage device such as a magnetic or optical disk or flash memory) as a permanent storage device. Other embodiments can use a removable storage device (e.g., a floppy disk, a flash drive) as a permanent storage device. The system memory can be a read-and-write memory device or a volatile read-and-write memory, such as dynamic random access memory. The system memory can store some or all of the instructions and data that the processor needs at runtime.

Storage subsystem 110 can include any combination of computer readable storage media including semiconductor memory chips of various types (DRAM, SRAM, SDRAM, flash memory, programmable read-only memory) and so on. Magnetic and/or optical disks can also be used. In some embodiments, storage subsystem 110 can include removable storage media that can be readable and/or writeable; examples of such media include compact disc (CD), read-only digital versatile disc (e.g., DVD-ROM, dual-layer DVD-ROM), read-only and recordable Blu-Ray® disks, ultra-density optical disks, flash memory cards (e.g., SD cards, mini-SD cards, micro-SD cards, etc.), magnetic "floppy" disks, and so on. The computer readable storage media do not include carrier waves and transitory electronic signals passing wirelessly or over wired connections.

In some embodiments, storage subsystem 110 can store one or more software programs to be executed by processing unit(s) 105. "Software" refers generally to sequences of instructions that, when executed by processing unit(s) 105 cause computing system 100 to perform various operations, thus defining one or more specific machine implementations that execute and perform the operations of the software programs. The instructions can be stored as firmware residing in read-only memory and/or applications stored in magnetic storage that can be read into memory for processing by a processor. Software can be implemented as a single program or a collection of separate programs or program modules that interact as desired. Programs and/or data can be stored in non-volatile storage and copied in whole or in part to volatile working memory during program execution. From storage subsystem 110, processing unit(s) 105 can retrieves program instructions to execute and data to process in order to execute various operations described herein.

A user interface can be provided by one or more user input devices 120, display device 125, and/or and one or more other user output devices (not shown). Input devices 120 can include any device via which a user can provide signals to computing system 100; computing system 100 can interpret the signals as indicative of particular user requests or information. In various embodiments, input devices 120 can include any or all of a keyboard, touch pad, touch screen, mouse or other pointing device, scroll wheel, click wheel, dial, button, switch, keypad, microphone, and so on.

Display 125 can display images generated by computing system 100 and can include various image generation technologies, e.g., a cathode ray tube (CRT), liquid crystal display (LCD), light-emitting diode (LED) including organic light-emitting diodes (OLED), projection system, or the like, together with supporting electronics digital-to-analog or analog-to-digital converters, signal processors, or the like). Some embodiments can include a device such as a touchscreen that function as both input and output device. In some embodiments, other user output devices can be provided in addition to or instead of display 125. Examples include indicator lights, speakers, tactile "display" devices, printers, and so on.

In some embodiments, the user interface can provide a graphical user interface, in which visible image elements in certain areas of display 125 are defined as active elements or control elements that the user can select using user input devices 120. For example, the user can manipulate a user input device to position an on-screen cursor or pointer over the control element, then click a button to indicate the selection. Alternatively, the user can touch the control element (e.g., with a finger or stylus) on a touchscreen device. In some embodiments, the user can speak one or more words associated with the control element (the word can be, e.g., a label on the element or a function associated with the element). In some embodiments, user gestures on a touch-sensitive device can be recognized and interpreted as input commands; these gestures can be but need not be associated with any particular array in display 125. Other user interfaces can also be implemented.

Network interface 135 can provide voice and/or data communication capability for computing system 100. In some embodiments, network interface 135 can include radio frequency (RF) transceiver components for accessing wireless voice and/or data networks (e.g., using cellular telephone technology, advanced data network technology such as 3G, 4G or EDGE, WiFi (IEEE 802.11 family standards, or other mobile communication technologies, or any combination thereof), GPS receiver components, and/or other components. In some embodiments, network interface 135 can provide wired network connectivity (e.g., Ethernet) in addition to or instead of a wireless interface. Network interface 135 can be implemented using a combination of hardware (e.g., antennas, modulators/demodulators, encoders/decoders, and other analog and/or digital signal processing circuits) and software components.

Bus 140 can include various system, peripheral, and chipset buses that communicatively connect the numerous internal devices of computing system 100. For example, bus 140 can communicatively couple processing unit(s) 105 with storage subsystem 110. Bus 140 also connects to input devices 120 and display 125. Bus 140 also couples computing system 100 to a network through network interface 135. In this manner, computing system 100 can be a part of a network of multiple computer systems (e.g., a local area network (LAN), a wide area network (WAN), an Intranet, or a network of networks, such as the Internet. Any or all components of computing system 100 can be used in conjunction with the invention.

A camera 145 also can be coupled to bus 140. Camera 145 can be mounted on a side of computing system 100 that is on the opposite side of the mobile device as display 125. Camera 145 can be mounted on the "back" of such computing system 100. Thus, camera 145 can face in the opposite direction from display 125.

Some embodiments include electronic components, such as microprocessors, storage and memory that store computer program instructions in a computer readable storage medium. Many of the features described in this specification can be implemented as processes that are specified as a set of program instructions encoded on a computer readable storage medium. When these program instructions are executed by one or more processing units, they cause the processing unit(s) to perform various operation indicated in the program instructions. Examples of program instructions or computer code include machine code, such as is produced by a compiler, and files including higher-level code that are executed by a computer, an electronic component, or a microprocessor using an interpreter.

Through suitable programming, processing unit(s) 105 can provide various functionality for computing system 100. For example, processing unit(s) 105 can execute a crowd-modeling application. In some embodiments, the crowd-modeling application is a software-based process that can send geographical location information over networks to a remote server and receive, from the remote server, a crowd model that the remote server generated based on geographical location information received from a multitude of separate mobile devices.

It will be appreciated that computing system 100 is illustrative and that variations and modifications are possible. Computing system 100 can have other capabilities not specifically described here e.g., mobile phone, global positioning system (GPS), power management, one or more cameras, various connection ports for connecting external devices or accessories, etc.). Further, while computing system 100 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of apparatus including electronic devices implemented using any combination of circuitry and software.

Real-Time Environment Modeling

Many indoor spaces, such as airports, involve systems of motion in which different people move about in different directions. Often, these systems involve people collectively moving in a particular direction or toward a particular location. In many indoor spaces, information about how such a system operates can be used to make educated guesses about the future states of the system. For example, an airport might contain multiple separate security lines, or queues. At any particular time, some of these security lines or queues might be longer than others. People attempting to get from one location in the airport e.g., the entrance) to another location (e.g., the departure gate) would find it tremendously helpful to know approximately how long they will be waiting in a security line. Having this information would allow travelers to allocate sufficient time prior to their flight to traverse the security line, without unnecessarily allocating too much time, which can result in an undesirable wait at the end location (e.g., the departure gate). Very few people like to wait in line.

In some situations, there may be a set of multiple security lines, some subset of which a particular person can choose to pass through in order to reach his destination within the airport. For example, there might be five different security lines, and a traveler might be able to choose to wait in any one of those security lines in order to pass through a security checkpoint and continue on to his gate. Under such circumstances, a person would find it highly useful to know which of the security lines he ought to choose in order to reach his destination the fastest.

In an embodiment of the invention, a person's mobile device, such as a smart phone, can act as a sensor of the environment (e.g., an airport) in which the person is currently located. Using its sensors, the mobile device can gather current information about that environment and transmit that information wirelessly over data communication networks to a remote server. The remote server can receive this kind of current environmental information from multiple separate mobile devices that are located at different spots within the same environment. Based on the information that the remote server collects from the multitude of mobile devices, the remote server can generate a current model of the environment. The model can indicate, for example, an estimated quantity of people that are currently located within the environment. The model can indicate an estimation of what those people are currently doing.

Based on such a model, actions can be defined. For example, using such a model, a user of a mobile device can be informed, via a service, that travel from the airport entrance to a specified departure gate will require an estimated amount of time. The service can inform the user of the mobile device, in real-time, what the current estimated wait times are for various security lines within the airport.

Furthermore, as multiple iterations of current model information are generated over time, a history of the model can be constructed. This history can be used to predict future wait times based on current conditions. For example, a history can indicate, for many different mobile device users, the amount of time it actually took those users to traverse a particular security line from end to end. The history can indicate, for each of those users, a quantity of other people who were known also to be in the same particular security line at the time that those users entered the particular security line. Based on this historical information, and also on the quantity of other people known to be ahead of a particular user currently waiting in the particular security line, a remote server can mathematically generate an estimate of the amount of time that the particular user will probably spend waiting in the particular security line starting at the current moment.

Thus, an embodiment of the invention can use environmentally sensed information accumulated from multiple mobile devices in order to determine current characteristics of the environment in which the multiple mobile devices are currently located. An embodiment of the invention can use the determined current characteristics of the environment to motivate behaviors of users of the mobile devices that are currently located within the environment. For example, based on the current characteristics of the environment, a remote server can send messages to a subset of the mobile devices, instructing the users of those mobile devices to travel in a particular direction, thereby reducing overall wait times in the environment. An embodiment of the invention can use a collected history of the characteristics of the environment to predict what the characteristics of the environment will be at a specified future moment in time.

Figure 2:
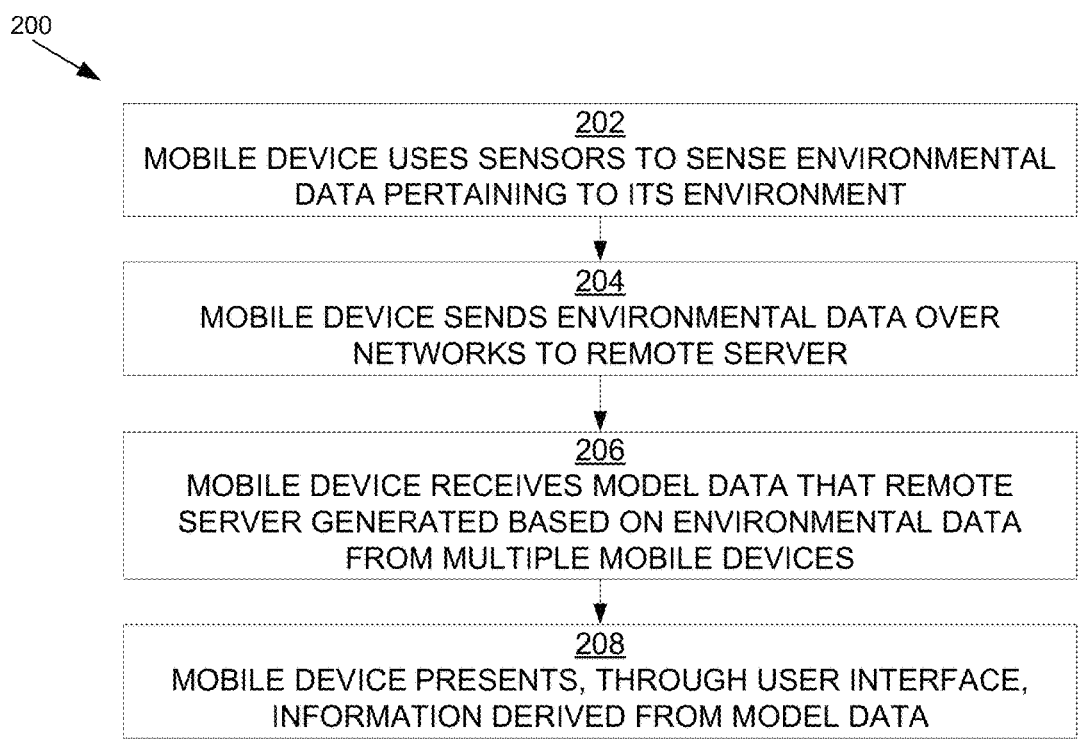
FIG. 2 is a flow diagram illustrating an example of a technique that a mobile device can use to obtain current characteristics of an environment in which the mobile device is located, according to an embodiment of the invention.

FIG. 2 is a flow diagram illustrating an example of a technique 200 that a mobile device can use to obtain current characteristics of an environment in which the mobile device is located, according to an embodiment of the invention. In block 202, the mobile device can use its sensors to sense environmental data pertaining to the environment in which the mobile device is currently located. In one embodiment, the mobile device can use its built-in global positioning system (GPS) to determine its geographical coordinates automatically; these geographical coordinates can be included within the environmental data that the mobile device senses. In block 204, the mobile device can send the environmental data over wireless networks to a remote server that is separate from the mobile device. The remote server can receive this environmental data from the mobile device. Additionally, the remote server can receive other environmental data from other mobile devices that are currently located in the same environment. Based at least in part on the environmental data received from each of the mobile devices currently located in the environment, the remote server can generate model data that indicates current characteristics of the environment. The remote server can send this model data over wireless networks to each of the mobile devices from which the remote server received environmental data. In block 206, the mobile device can receive the model data over wireless networks from the remote server. In block 208, the mobile device can present, through a user interface such as a display, information derived from the model data. For example, the information can indicate an estimated amount of time that will be required to pass through a security line in which a user of the mobile device is currently waiting.

Figure 3:
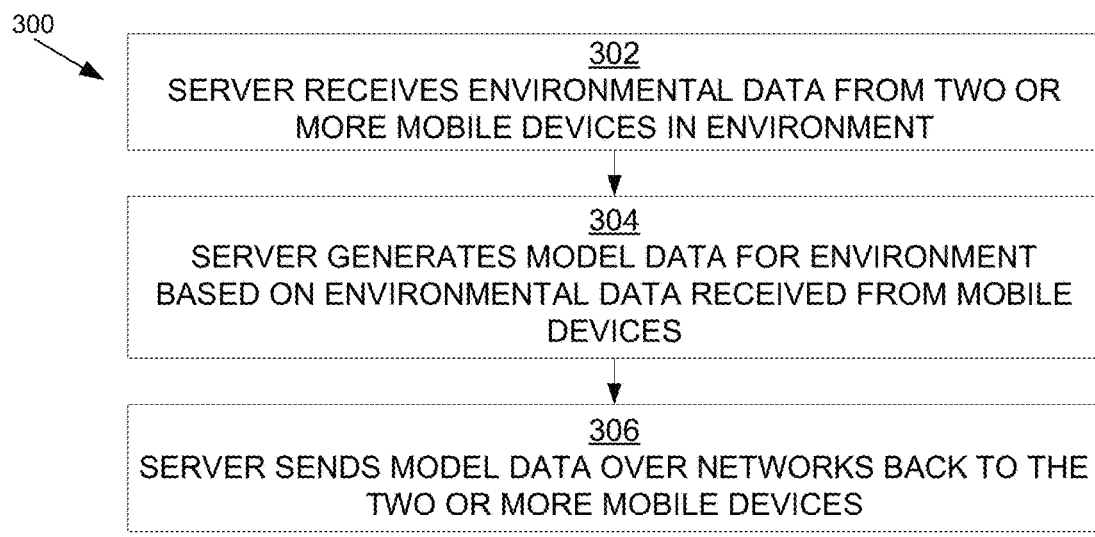
FIG. 3 is a flow diagram illustrating an example of a technique that a server can use to generate a model of an environment in which multiple mobile devices are currently located based on environmental data received from each of those mobile devices, according to an embodiment of the invention.

FIG. 3 is a flow diagram illustrating an example of a technique 300 that a server can use to generate a model of an environment in which multiple mobile devices are currently located based on environmental data received from each of those mobile devices, according to an embodiment of the invention. In block 302, the server can receive, over wireless networks from each of two or more mobile devices, environmental data pertaining to the environment in which each of the two or more mobile devices is located. For each particular mobile device of the two or more mobile devices, the environmental data received from that particular mobile device can include data that the particular mobile device sensed using its sensors. In block 304, based at least in part on the environmental data that the server received from each of the two or more mobile devices in block 302, the server can generate model data that indicates current characteristics of the environment. For example, the model data can indicate an estimated amount of time that will be required for a person to travel from one specified point in the environment to another specified point in the environment under circumstances where the path of travel includes one or more security lines. For another example, the model data can indicate an estimated quantity of people who are currently within such security lines. In block 306, the server can send the model data over wireless networks to each of the two or more mobile devices from which the environmental data was received. The model data can indicate characteristics of the environment that are additional to characteristics indicated within the environmental data that the server received from any single one of the mobile devices, such that the model data essentially aggregates the environmental data received from multiple mobile devices to produce a "bigger picture" of the environment.

Significantly, an embodiment of the invention can involve generating models of the environment in real-time, so that the model of the environment is fresh, current, and relatively up-to-date at any given moment in time. Thus, in one embodiment of the invention, multiple mobile devices can periodically sense new environmental data and periodically send that environmental data to a server. The server can periodically receive that new environmental data from the mobile devices and periodically generate new model data based on that new environmental data. The server can periodically send that new model data to each of the mobile devices. Each of the mobile devices can periodically receive that new model data and periodically present, to users of those mobile devices, updated information derived based at least in part on the most recently received version of the model data.

Figure 4:
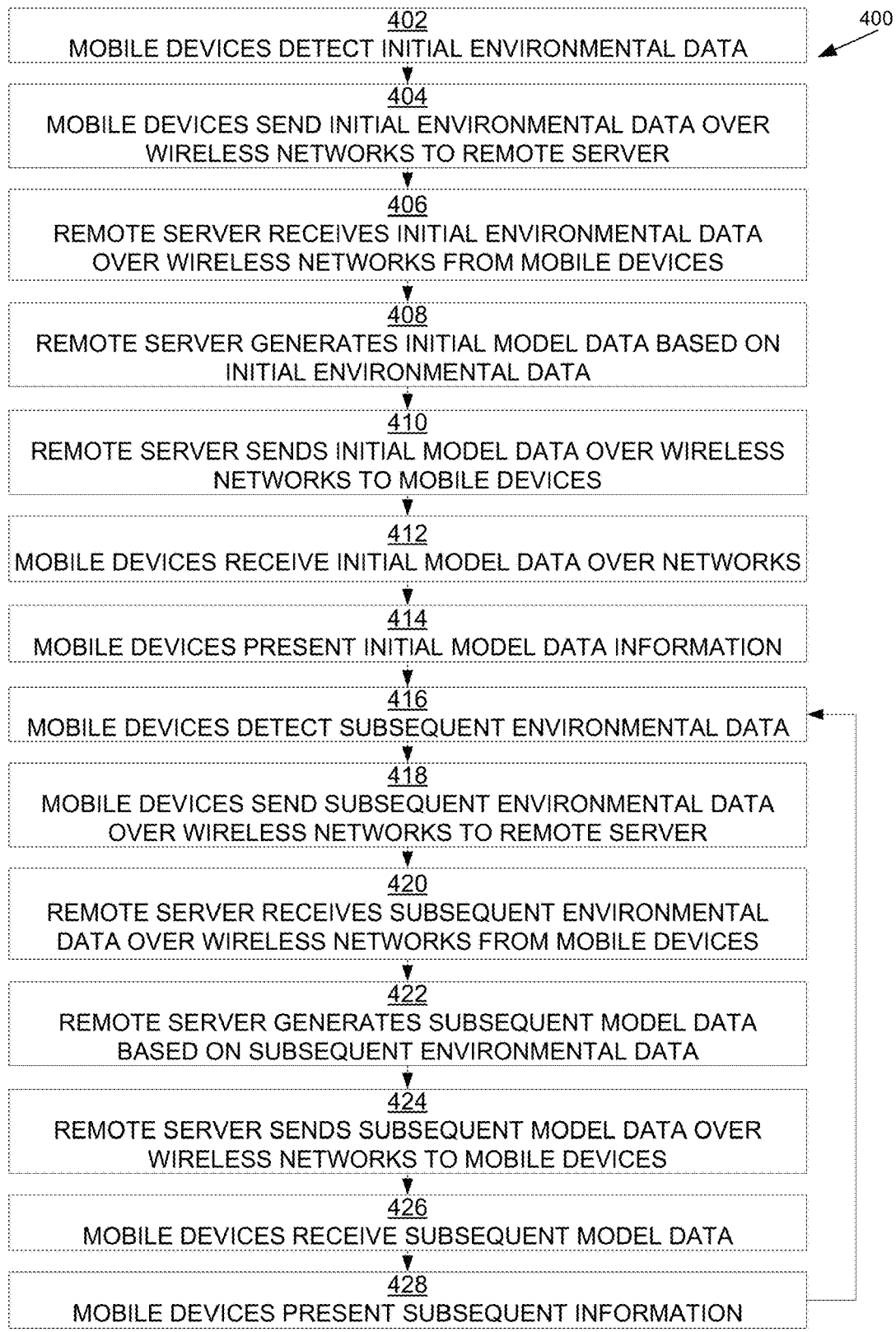
FIG. 4 is a flow diagram illustrating an example of a technique that multiple mobile devices and a server can use to periodically and cooperatively generate, in real-time, new models of an environment in which the mobile devices are currently located, according to an embodiment of the invention.

FIG. 4 is a flow diagram illustrating an example of a technique 400 that multiple mobile devices and a server can use to periodically and cooperatively generate, in real-time, new models of an environment in which the mobile devices are currently located, according to an embodiment of the invention. In block 404, at an initial moment in time, multiple mobile devices can use their sensors to sense initial environmental data pertaining to the environment in which the mobile devices are currently located. In block 404, the mobile devices can send the initial environmental data over wireless networks to a remote server that is separate from the mobile devices. In block 406, the remote server can receive, over wireless networks from each of the mobile devices, the initial environmental data pertaining to the environment in which each the mobile devices is located. In block 408, based at least in part on the initial environmental data that the remote server received from each of the mobile devices in block 406, the remote server can generate initial model data that indicates current characteristics of the environment. In block 410, the remote server can send the initial model data over wireless networks to each of the mobile devices from which the initial environmental data was received. In block 412, the mobile devices can receive the initial model data over wireless networks from the remote server. In block 414, the mobile devices can present, through user interfaces such as displays, information derived from the initial model data.

In block 416, at a subsequent moment in time later than the initial moment in time, the multiple mobile devices can use their sensors to sense subsequent environmental data pertaining to the environment in which the mobile devices are currently located. In block 418, the mobile devices can send the subsequent environmental data over wireless networks to the remote server. In block 420, the remote server can receive the subsequent environmental data over wireless networks from each of the mobile devices. In block 422, based at least in part on the subsequent environmental data that the remote server received from each of the mobile devices in block 420, the remote server can generate subsequent model data that indicates current characteristics of the environment. Inasmuch as environmental characteristics tend to change over time, the characteristics indicated in the subsequent model data can differ from the characteristics indicated in the initial model data. In block 424, the remote server can send the subsequent model data over wireless networks to each of the mobile devices from which the subsequent environmental data was received. In block 426, the mobile devices can receive the subsequent model data over wireless networks from the remote server. In block 428, the mobile devices can present, through user interfaces such as displays, information derived from the subsequent model data. Control then passes back to block 416 at yet a later moment in time, and the process described above can be repeated in order to continuously produce real-time model data reflecting current characteristics of the environment.

Locating Bottlenecks in Indoor and Outdoor Environments

As is discussed above, in one embodiment of the invention, mobile devices can automatically sense environmental characteristics of an indoor venue such as an airport, for example. Such environmental characteristics, when taken in aggregate from multiple mobile devices reporting such characteristics, can be used to formulate a model that can indicate, among other characteristics, locations within the venue at which mobile device users are currently clustered. Multiple measurements of such characteristics over time can be used to determine rates and directions of movements of mobile device users within those clusters, and therefore the rates and directions of movements of the clusters as a whole. Thus, in one embodiment of the invention, the model formulated from environmental characteristics periodically reported from various mobile devices in an environment can indicate (1) where bottlenecks of movement, such as security lines in an airport, are located within an environment, and (2) an approximate amount of time that will be required to pass from one end of such a bottleneck to the other end, given the direction and rate of movement of the cluster at the bottleneck. For example, a bottleneck and therefore a potential line can be detected automatically by determining that at least a specified quantity of users is located in a region with at least a specified density, and that the average speed of movement of those users within the region is less than a specified speed. If a significant quantity of mobile device users are located in a region with at least a specified density and with average movement at less than a specified speed, then that region can be automatically determined to be a bottleneck within the environment, and therefore a place at which a security line (if the environment is an airport, for example) likely exists. Embodiments of the invention can also be used to estimate lengths of queues at amusement parks, for example. Using the techniques described herein, users of mobile devices can determine which of a park's rides currently have the shortest wait times.

In one embodiment of the invention, mobile devices can additionally or alternatively automatically sense environmental characteristics of an outdoor venue such as a ski resort, for example. By using techniques similar to those discussed above, bottlenecks can be detected within an outdoor environment. In the context of a ski resort, these bottlenecks may be indicative of lines in which mobile device users are waiting in order to board a ski lift, for example. In one embodiment of the invention, regardless of whether the environment is an indoor venue or an outdoor venue, the model formulated based on the environmental characteristics reported from multiple mobile devices in the environment indicates, among other possible facts, a current amount of time that is estimated to be required to pass through each of the known bottlenecks in the environment. These amounts of time can be reported back to the mobile devices, and hence to their users, for each of the known bottlenecks. Thus, in one embodiment of the invention, mobile devices display, to their users, the locations in the environment at which lines or other bottlenecks exist, and, for each such line or bottleneck, the estimated current wait time required to pass through that line or bottleneck. Users of the mobile device can use such information in order to select, from the various lines, a particular line that has a current wait time that is acceptable to those users. This can have the beneficial feature of "routing" mobile device users to lines having lesser wait times, thereby potentially reducing the wait times of lines currently having greater wait times, producing more balance in wait times in lines within the overall environment.

Determining Locations in Indoor Venues

As is discussed above, in one embodiment of the invention, mobile devices sense characteristics of an environment at least in part by using built-in global positioning systems of those mobile devices. In doing so, the mobile devices can automatically ascertain their own geographical locations and report these locations, or coordinates, to a server so that the server can aggregate these locations in order to construct a bigger picture of where people in the environment currently are and where those people are going. However, sometimes in indoor venues such as buildings, global positioning systems are less effective at sensing environmental characteristics because the walls and ceilings of the venues can obstruct the reception of satellite signals upon which the global positioning systems rely. Furthermore, global positioning systems sometimes can give only a coarse indication of a geographical location, and imprecision can be undesirable when location within a more confined space such as a building is called for.

Therefore, in an alternative embodiment of the invention, alternative techniques can be used for determining the locations of mobile devices within indoor venues such as buildings. In such alternative embodiments, a mobile device can estimate its location using one or more of, or a combination of several of, the following: cellular telephone signals, WiFi network signals, Bluetooth signals, other radio frequency signals, etc. Software executing on a mobile device can be configured with information indicating a source and location of each of these signals relative to the indoor venue. By determining the relative strength of each such signal and using information indicating the location of the source of each such signal, the mobile device can automatically estimate its current location within the indoor venue even without the use of a global positioning system. For example, if a first signal from a first source is relatively weak, but if a second signal from a second source is relatively strong (relative to the first signal), then the mobile device can estimate that it is closer to the location of the second source than it is to the location of the first source. In one embodiment of the invention, the mobile device can use a compass and accelerometer to determine, over time, a direction and speed at which its user is moving within the indoor venue. As the mobile device moves through the indoor venue, the mobile device can measure the strengths of various signals over time. Based on these measurements, the mobile device can determine that as it moves in a particular direction at a particular speed, some of the signals from some of the sources may become stronger at certain rates, while others of the signals from others of the sources may become weaker at certain rates. Based at least in part on the direction and speed of the mobile device's movement, the measured differing strengths of signals from various sources over a time interval, and the known geographical locations of the sources of those signals, the mobile device can automatically determine its approximate distance from each of those sources over the time interval. Thus, the mobile device can automatically determine its position within the indoor venue, and can transmit this positional information wirelessly to the remote server discussed above.

In one embodiment of the invention, samples of the radio frequency (RF) environment are taken at various geographical points within an indoor venue. Given that a sensory device can encounter different strengths of different RF signals at each point, a different RF "fingerptint" can be ascertained and recorded by the sensory device at each point in the sampling. A user of the sensory device can store a mapping between his known geographical coordinates (which can be determined using any approach) and the RF fingerprint sensed by the sensory device at those coordinates. Thus, a database of mappings between geographical coordinates and corresponding RF fingerprints for a particular indoor venue can be constructed. Later, when other mobile devices are present within the particular indoor venue, those mobile devices can use their sensors to detect the distinct RF fingerprints at their current locations. Then, by consulting the database pertaining to its current indoor venue, a mobile device can estimate its current coordinates by locating the currently sensed RF fingerprint and determining the geographical coordinates that are mapped to that RF fingerprint; those geographical coordinates are the mobile device's current geographical coordinates. The mobile device can then transmit these geographical coordinates wirelessly to the remote server discussed above. Alternatively, if the RF fingerprint database is stored at the remote server, then the mobile device can transmit its currently sensed RF fingerptint to the remote server, and the remote server can then automatically determine the mobile device's current coordinates based at least in part on that RF fingerprint.

In an embodiment of the invention, the mobile device is configured with a particle filter that can employ Bayesian estimates. In an embodiment of the invention, a state-space model can be used. The state-space model is an estimator that has a time scale. In the model, the current time transitions from one time to another along the time scale. At each time along the scale, the mobile device can make an environmental observation such as an observation of the kind discussed above (e.g., an RF fingerprint measurement). When the mobile device's user moves, the mobile device's user can be assumed to move with some constraints. For example, some information about the environment or venue in which the mobile device's user is located, such as the locations of walls, furniture, other obstacles, etc., can be used to determine constraints upon the mobile device user's movement within that venue. These kinds of constraints are referred to herein as "map constraints." If the user was determined to be on one side of a wall during one time interval and if the user was determined to be on the other side of the wall during an immediately following time interval, then the mobile device can determine that the user must have moved around the wall in between those time intervals.

According to an embodiment of the invention, the mobile device can use its sensors in order to determine a direction in which the mobile device's user tends to walk. The mobile device can use its sensors in order to determine a speed at which the user walks. By supplementing this sensor-detected information with information known about map constraints for the venue, the determination of where the user is and where the user is going can be made more accurate. Using a Fourier Transform, a spectrum of the user's motion can be determined based on the sensor data.

Observing Movements to Estimate Motion Bottleneck Points

Thus, techniques discussed above can be used to determine, for each mobile device user within a particular environment, (a) that user's current location, (b) the direction in which that user is headed, and (c) the speed at which that user is moving. For example, there may be an environment containing a security line in which mobile device users (among potentially others) stand waiting or slowly moving. Each mobile device user in the environment can be modeled as a separate particular. In an embodiment of the invention, each of one or more such modeled particles is observed over time in order to estimate an amount of time that will be required for anyone to move through the environmental system being observed (e.g., a security line). According to an embodiment of the invention, fewer than all of the mobile device users' motions are used in order to perform this estimation. Instead, a limited sample including a subset of the mobile device users present in the environment can be used to perform the estimation. By examining the motions of some mobile device users in a group of people, the motions of the whole group can be predicted. Known information about the environment, such as knowledge that security checkpoints exist at certain locations in the environment, can be used to detect the presence of a security line or other motion-limiting bottleneck point.

The observation of the motions of multiple mobile devices over time can give rise to the observation that a particular subset of those mobile devices within the environment are correlated with each other to an extent that meets or exceeds some threshold of correlation. Even if map information regarding the environment does not indicate locations at which movement bottlenecks such as security lines are likely to form, the discovery of these groups of mobile devices whose movements within the environment over time are so highly correlated can be used as a factor in automatically determining the presence and locations of such bottlenecks within the environment. The certainty that a motion bottleneck exists at a particular point within an environment can be increased as additional information regarding the environment and/or the movements of mobile device users increases.

Although map information regarding the environment in which the mobile devices are located is not necessarily required in order to determine the locations of motion bottlenecks within the environment, such information can be used to help eliminate false alerts. For example, map information regarding an environment may contain information indicating that a restaurant is located next to a security line. The knowledge that the environment contains a restaurant can be used to avoid a determination that the security line includes the region in which the restaurant is located. Thus, map information regarding the environment can be used in order to determine with greater accuracy where motion bottlenecks such as security lines exist within the environment. However, the techniques discussed above for determining the presence and movements of crowds of people, based on the detected movements of their mobile devices over time, can be used to model and predict future crowd behaviors within that environment even if no specific map information about the environment is known.

Real-Time Reporting

As is discussed above, crowd-sourcing techniques can be used in order to gather motion information about multiple mobile devices within an environment. Each participating mobile device can wirelessly upload its own motion information to a server that aggregates such motion information that the server receives from multiple mobile devices performing such uploads. Having aggregated this information in order to estimate conclusions about the movements of crowds of people within the environment, the server can then make these conclusions available to all mobile devices that seek to wirelessly download those conclusions from the server. For example, a mobile device can download information about the predicted wait time for a particular security line and then present that information to its user in order to enable the user to make an intelligent decision regarding his future actions. The user can decide to arrive at the environment by a certain time in order to allow him adequate time to traverse the particular security line, for example.

Certain embodiments of the invention can employ techniques that help to ensure that the information that the server makes available to mobile devices is current, fresh, and useful. Although the server might have some information pertaining to crowd movement behavior within the environment over long periods of time, such crowd movement behavior is not necessarily guaranteed to remain consistent of such long periods of time. Thus, in one embodiment of the invention, the server can give greater weight to more recent environmental observations received from mobile devices, and give relatively lesser weight to less recent environmental observations received from mobile devices. In this manner, old and potentially stale information can gradually be phased out or minimized so that crowd movement information is more likely to be up-to-date and accurate. By causing more recent crowd movement information to be given greater significance than less recent crowd movement information, the server can better enable the real-time reporting of conditions within the environment, including the locations of queues and the estimated times required to traverse those queues.

Thus, according to an embodiment of the invention, the server can continuously receive environmental observations and crowd movement behavioral information from mobile devices, and can continuously update its stored observations and conclusions based on the most recently received data. Because the server can base the crowd motion behavior information that it provides to various mobile devices upon continuously updated data, the mobile devices can receive helpful information pertaining to the environment effectively in real-time. This differs from an approach in which the server would merely infer present crowd motion behavior based solely on measurements acquired in the distant past.

In one embodiment of the invention, a mobile device can send, to the server, information regarding a planned route of travel through an environment. In response to receiving this planned route information, the server can determine the set of queues or other motion bottlenecks through which the planned route travels. Based on the current estimates of time needed to traverse each area through which the planned route passes, the server can compute a total amount of time that will currently be required for the mobile device's user to make the journey indicated by the planned route. The server can report this total to the mobile device, which can display or otherwise report the total to its user.

Mobile device users are not necessarily the only people that can benefit from the crowd movement information that the server accumulates and aggregates. In an embodiment of the invention, the server can provide crowd movement information in real-time to a manager or operator of the venue or environment to which the crowd movement information pertains. Based on this real-time information, the manager or operator of the venue can decide to change the paths through which present and future crowds are routed within the environment; for example, the manager might responsively decide to re-allocate personnel from one location in the environment to another location in order to cause a more heavily frequented queue to move more rapidly. For another example, the manager might responsively decide to set up signs or temporary barriers to direct crowds to move along paths alternative to those along which crowds have been moving, in order to alleviate congestion within the environment. For another example, an advertiser might use information about crowd movements in order to cause electronic advertisements to be displayed (and paid for) at locations within avenue at which crowds are known currently to be located, based on the real-time reporting from the server.

Embodiments of the present invention can be realized using any combination of dedicated components and/or programmable processors and/or other programmable devices. The various processes described herein can be implemented on the same processor or different processors in any combination. Where components are described as being configured to perform certain operations, such configuration can be accomplished, e.g., by designing electronic circuits to perform the operation, by programming programmable electronic circuits (such as microprocessors) to perform the operation, or any combination thereof. Further, while the embodiments described above can make reference to specific hardware and software components, those skilled in the art will appreciate that different combinations of hardware and/or software components can also be used and that particular operations described as being implemented in hardware might also be implemented in software or vice versa.

Computer programs incorporating various features of the present invention can be encoded and stored on various computer readable storage media; suitable media include magnetic disk or tape, optical storage media such as compact disk (CD) or DVD (digital versatile disk), flash memory, and other non-transitory media. Computer readable media encoded with the program code can be packaged with a compatible electronic device, or the program code can be provided separately from electronic devices e.g., via Internet download or as a separately packaged computer-readable storage medium).

Thus, although the invention has been described with respect to specific embodiments, it will be appreciated that the invention is intended to cover all modifications and equivalents within the scope of the following claims.

What is claimed is:

1. A method comprising:
    collecting, by a server, sensor data sensed by sensors of a plurality of mobile devices, wherein the sensor data comprises location data pertaining to a location in which the plurality of mobile devices are located;
    determining, by the server, an estimated wait time for a specified future moment in time of the location;
    wherein the estimated wait time is determined by:
        utilizing a history of location data that was generated over time for the time corresponding to specified future moment in time of the location, in order to predict a wait time for the specified future moment in time of the location;
    wherein the history of location data provides:
        amounts of time that one or more of the plurality of mobile devices took to traverse a line at the location during the time corresponding to specified future moment in time of the location; and
        quantities of one or more of the plurality of mobile devices of people that are in the line when a device of the plurality of mobile devices entered the line during the time corresponding to specified future moment in time of the location; and
    presenting the estimated wait time for the specified future moment in time of the location.

2. The method of claim 1, wherein the location data comprises geographical coordinates of the plurality of mobile devices determined using a global positioning system of each of the plurality of mobile devices.

3. The method of claim 1, further comprising:
    collecting, at the server, from the plurality of mobile devices, second sensor data pertaining to the location in which the plurality of mobiles devices are located, wherein the second sensor data is sensed at a different moment in time from the sensor data, and wherein the second sensor data includes, for each of the plurality of mobile devices, at least one of a radio frequency (RF) fingerprint usable to estimate current geographical coordinates and current geographical coordinates;
    generating, based at least in part on the second sensor data collected from the plurality of mobile devices, second location data indicating current characteristics of the location; and
    updating the history of location data in accordance with the second location data.

4. The method of claim 1, further comprising:
    determining one or more bottlenecks of movement at the location in which an average rate of movement of mobile devices through the location is less than a specified speed.

5. The method of claim 1, wherein the estimated wait time indicates an estimated amount of time that will be required to pass through the line.

6. The method of claim 1, wherein the determining the estimated wait time for the specified future moment in time of the location comprises determining rates of movement and directions of movement of mobile device users within a cluster of mobile device users.

7. The method of claim 1, wherein the determining the estimated wait time for the specified future moment in time of the location comprises determining an average speed of mobile device users within a region and a density of the mobile device users within the region.

8. The method of claim 1, wherein the estimated wait time for the specified future moment in time of the location is presented on a display of a mobile device of the plurality of mobile devices.

9. The method of claim 1, wherein the estimated wait time for the specified future moment in time of the location is presented on a display at the location.

10. A non-transitory computer-readable memory storing instructions which, when executed by one or more processors, cause the one or more processors to:
collect sensor data sensed by sensors of a plurality of mobile devices, wherein the sensor data comprises location data pertaining to a location in which the plurality of mobile devices are located;
determine an estimated wait time for a specified future moment in time of the location;
wherein the estimated wait time is determined by:
utilizing a history of location data that was generated over time for the time corresponding to specified future moment in time of the location, in order to predict a wait time for the specified future moment in time of the location;
wherein the history of location data provides:
amounts of time that one or more of the plurality of mobile devices took to traverse a line at the location during the time corresponding to specified future moment in time of the location; and
quantities of one or more of the plurality of mobile devices of people that are in the line when a device of the plurality of mobile devices entered the line during the time corresponding to specified future moment in time of the location; and
present the estimated wait time for the specified future moment in time of the location.

11. The computer-readable memory of claim 10, wherein the location data comprises geographical coordinates of the plurality of mobile devices determined using a global positioning system of each of the plurality of mobile devices.

12. The computer-readable memory of claim 10, further comprising instructions that cause the one or more processors to:
collect from the plurality of mobile devices, second sensor data pertaining to the location in which the plurality of mobiles devices are located, wherein the second sensor data is sensed at a different moment in time from the sensor data, and wherein the second sensor data includes, for each of the plurality of mobile devices, at least one of a radio frequency (RF) fingerprint usable to estimate current geographical coordinates and current geographical coordinates;
generate, based at least in part on the second sensor data collected from the plurality of mobile devices, second location data indicating current characteristics of the location; and
update the history of location data in accordance with the second location data.

13. The computer-readable memory of claim 10, further comprising instructions that cause the one or more processors to:
determine one or more bottlenecks of movement at the location in which an average rate of movement of mobile devices through the location is less than a specified speed.

14. The computer-readable memory of claim 10, wherein the estimated wait time indicates an estimated amount of time that will be required to pass through the line.

15. The computer-readable memory of claim 10, wherein the determining the estimated wait time for the specified future moment in time of the location comprises determining rates of movement and directions of movement of mobile device users within a cluster of mobile device users.

16. The computer-readable memory of claim 10, wherein the determining the estimated wait time for the specified future moment in time of the location comprises determining an average speed of mobile device users within a region and a density of the mobile device users within the region.

17. The computer-readable memory of claim 10, wherein the estimated wait time for the specified future moment in time of the location is presented on a display of a mobile device of the plurality of mobile devices.

18. The computer-readable memory of claim 10, wherein the estimated wait time for the specified future moment in time of the location is presented on a display at the location.

* * * * *